United States Patent [19]
Kurihara et al.

[11] Patent Number: 5,408,488
[45] Date of Patent: Apr. 18, 1995

[54] SEMICONDUCTOR LASER DEVICE

[75] Inventors: Haruki Kurihara, Tokyo; Motoyuki Yamamoto, Kawasaki, both of Japan

[73] Assignee: Kabushiki Kaisha Toshiba, Kawasaki, Japan

[21] Appl. No.: 271,727

[22] Filed: Jul. 7, 1994

[30] Foreign Application Priority Data

Jul. 9, 1993 [JP] Japan .................. 5-170067

[51] Int. Cl.$^6$ ............................... H01S 3/19
[52] U.S. Cl. ........................ 372/46; 372/45
[58] Field of Search ...................... 372/45, 46

[56] References Cited

U.S. PATENT DOCUMENTS

| | | | |
|---|---|---|---|
| 4,893,313 | 1/1990 | Hatakoshi et al. | 372/46 |
| 5,289,487 | 2/1994 | Shimada | 372/46 |

FOREIGN PATENT DOCUMENTS

| | | |
|---|---|---|
| 0234955 | 9/1987 | European Pat. Off. . |
| 0526220 | 2/1993 | European Pat. Off. . |
| 4330987 | 5/1994 | Germany . |
| 57-89286 | 3/1982 | Japan . |
| 57-159084 | 10/1982 | Japan . |
| 60-115283 | 6/1985 | Japan . |
| 62-200785 | 9/1987 | Japan . |
| 62-200786 | 9/1987 | Japan . |
| 2-254779 | 10/1990 | Japan . |

*Primary Examiner*—James W. Davie
*Attorney, Agent, or Firm*—Finnegan, Henderson, Farabow, Garrett & Dunner

[57] ABSTRACT

A semiconductor laser device comprising, a first clad layer of the first conductivity type semiconductor crystal deposited on a first electrode layer, an active layer, a second clad layer formed of a semiconductor crystal of a second conductivity type, a current barrier layer having a stripe-like current inlet opening, a second electrode layer formed of a semiconductor crystal of the second conductivity type, and disposed on the current barrier layer and on the electric current inlet opening. A first electrode is formed on the second electrode layer. A second electrode is formed on the bottom surface of the first electrode layer. Between the current barrier layer and the second clad layer is formed a photoelectric current barrier layer formed of a semiconductor crystal of the first conductivity type having a larger band gap than that of the active layer.

5 Claims, 5 Drawing Sheets

F I G. 4
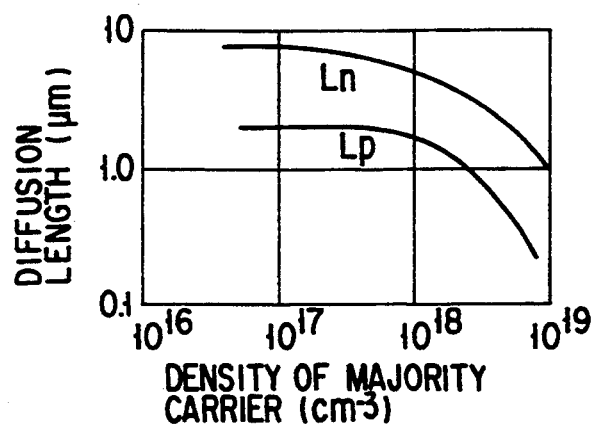
F I G. 7
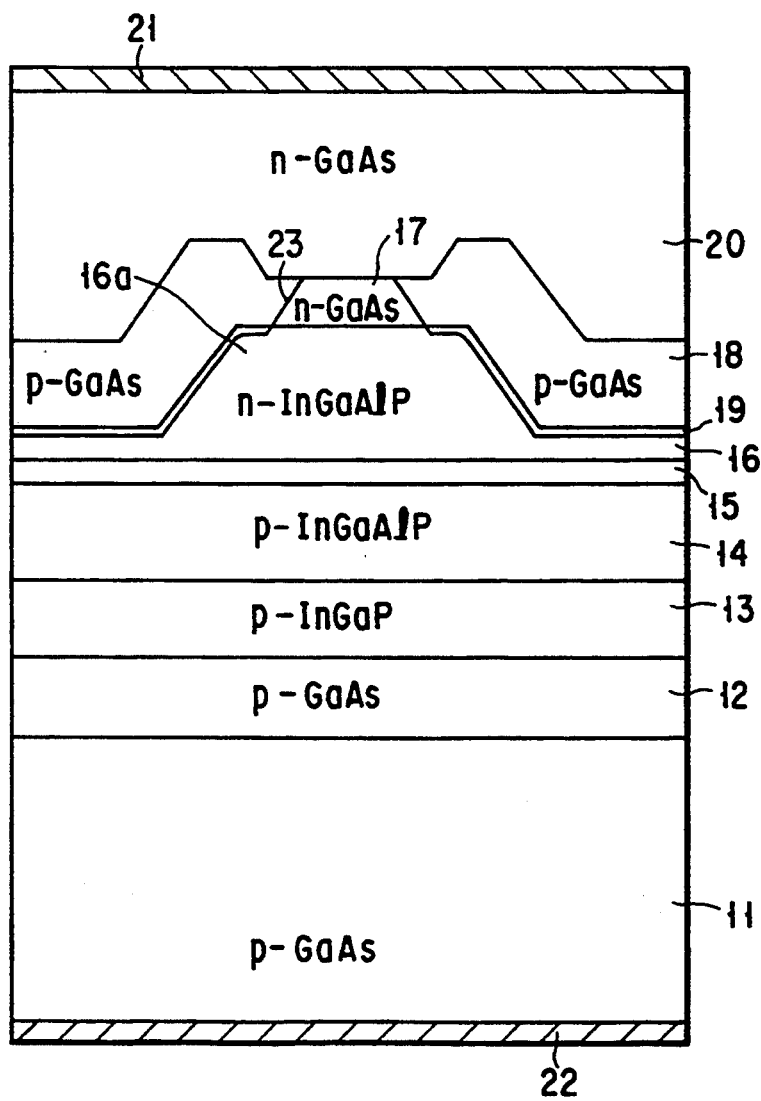

SEMICONDUCTOR LASER DEVICE

BACKGROUND OF THE INVENTION

1. Field of the Invention

This invention relates to a semiconductor laser device having a visible or near-infrared light semiconductor laser element to be used as a source of light for a barcord-reading device, a pointer, a pick-up of a photo disc device, an optical measuring apparatus and etc..

2. Description of the Related Art

As an example of a near-infrared light semiconductor laser element, one having a so-called inner stripe structure is known (for example, Jpn. Pat. Appln. KOKAI Publication No. 57-159084).

This semiconductor laser element is constructed as shown in FIG. 1 in such a manner that an electric current barrier layer 102 consisting of n-GaAs is first formed on the upper surface of a p-GaAs substrate 101, a stripe groove 103 having a stripe-like opening is formed in the electric current barrier 102 consisting of n-GaAs, and then a plurality of layers viz. a first clad layer 104 consisting of p-$Ga_{0.7}Al_{0.3}As$, an active layer 105 consisting of p-$Ga_{0.95}Al_{0.05}As$, a second clad layer 106 consisting of p-$Ga_{0.7}Al_{0.3}As$ and a cap layer 107 consisting of n-GaAs are stacked in this order over the n-GaAs electric current barrier 102. Additionally, an n-side electrode 108 is formed on the surface of the cap layer 107, while a p-side electrode 109 is formed on the back surface of the p-GaAs substrate 101.

In the near-infrared light semiconductor laser element constructed in this manner, an electron introduced from the anode 109 moves from the p-GaAs substrate 101 to the n-side electrode 108, passing through the stripe groove 103 formed in the electric current barrier 102, the p-$Ga_{0.7}Al_{0.3}As$ first clad layer 104, an n-$Ga_{0.95}Al_{0.05}As$ active layer 105, a p-$Ga_{0.7}Al_{0.3}As$ second clad layer 106 and an n-GaAs cap layer 107.

In this case, an n-p junction formed between the n-GaAs electric current barrier 102 and the p-$Ga_{0.7}Al_{0.3}As$ first clad layer 104 is reverse-biased, whereas a p-n junction formed between the p-GaAs substrate 101 and the n-GaAs electric current barrier 102, as well as a p-n junction formed between the p-$Ga_{0.7}Al_{0.3}As$ first clad layer 104 and the n-$Ga_{0.95}Al_{0.05}As$ active layer 105 are forward-biased.

Namely, when electric current is passed into the device through the n-side electrode 108 and the p-side electrode 109, only the limited region formed in the stripe groove 103 becomes an electric channel.

Accordingly, the laser oscillation is initiated only at the region near the p-$Ga_{0.95}Al_{0.05}As$ active layer 105 which corresponds to this current channel.

FIGS. 2 and 3 respectively illustrate an energy band at the portion which transverses the n-GaAs electric current barrier 102.

For example, the electric potentials, at the time of passing current, of each of the p-GaAs substrate 101, the n-GaAs electric current barrier 102, and the p-$Ga_{0.7}Al_{0.3}As$ first clad layer 104 become such as shown in FIG. 2.

In this FIG. 2, $\Delta E_c$ denotes an amount of discontinuity of conductive band at the hetero junction of the laser element; whereas $\Delta E_v$ denotes an amount of discontinuity of valent electron band at the hetero junction.

In view of the relationships between potentials, each of the p-GaAs substrate 101, the n-GaAs electric current barrier 102, and the p-$Ga_{0.7}Al_{0.3}As$ first clad layer 104 can be regarded as being an emitter (E), a base (B) and a collector (C) respectively.

Accordingly, it will be easily understood that as long as majority carriers (electrons) are not injected into the n-GaAs electric current barrier 102 corresponding to the base, the current passing through the electric current barrier 102 may be very little which can be practically neglected.

Thus, some of minority carriers (positive holes) to be injected into the base from the emitter by the forward bias reach to the collector to become a drift current, the remaining minority carriers are recombined with the majority carriers.

Accordingly, the base is charged positively as shown in FIG. 3, to a potential prevents injection of the minority carrier (positive hole) from the emitter into the base.

As a result, unless the electric charge is eliminated by injecting the majority carrier into the base, the electric current larger than this level can no more be possible to be supplied.

When the electric current barrier 102 functions in this manner, the portion which can be excited by the electric current is only the n-$Ga_{0.95}Al_{0.05}As$ active layer 105 disposed right above the stripe groove 103.

The light hv thus generated at this portion is guided by slab-like (laminar) light waveguide channel formed by the p-$Ga_{0.95}Al_{0.05}As$ active layer 105 and a pair of clad layers, i.e. the p-$Ga_{0.7}Al_{0.3}As$ first clad layer 104 and a p-$Ga_{0.7}Al_{0.3}As$ second clad layer 106.

At this occasion, part of the guided light leaks from the relatively thinner portions of the p-$Ga_{0.7}Al_{0.3}As$ first clad layer 104 disposed on both sides of the stripe groove 103, and is absorbed by the n-GaAs electric current barrier 102 as shown by the arrow in FIG. 1.

With the function of this light absorption, the guided light is locked in the waveguide channel right above the stripe groove 103 so that the mode status is considered as being stabilized.

By the way, as the light is absorbed in this manner, an electron-positive hole pair is generated within the n-GaAs electric current barrier 102.

For example, the positive hole indicated by a white circle in FIG. 3 is discharged by the potential gradient into the p-$Ga_{0.7}Al_{0.3}As$ first clad layer (collector) 104. As a result, only the electron indicated by a black circle is left in the n-GaAs electric current barrier (base) 102. This phenomenon can be considered as being an injection of electron into the base.

If this injection of electron is represented by the value of electric current (optically induced current) $I_{OPT}$, the electric charge can be eliminated when the value of $I_{OPT}$ is larger than the value of $I_{REC}$, which is obtained by converting the magnitude of recombination (i.e. a cause of above-mentioned charge) into an value of electric current. As a result, the n-GaAs electric current barrier 102 can no more keep its function.

Accordingly, it can be said that the relationships of $I_{OPT} < I_{REC}$ is an essential condition for the inner stripe structure to function its current-blocking property.

This condition can be met when the diffusion length Lp of minority carrier (positive hole) is smaller than the thickness $d_{CB}$ of the n-GaAs electric current barrier 102, i.e. when $L_p < d_{CB}$ is realized.

FIG. 4 illustrates the relationship between the diffusion length of minority carrier and density of majority carrier.

According to this FIG. 4, when the electron density is in the prescribed range of from $n = 2$ to $3 \times 10^{18}$ cm$^{-3}$ to 2 to $3 \times 10^{-9}$ cm$^{-3}$ that would be easily realized, the value of the diffusion length Lp of minority carrier (positive hole) becomes 1 μm or less, so that it is possible to make the thickness $d_{CB}$ of the n-GaAs electric current barrier 102 to about 1 μm or less.

A semiconductor laser element having these features is realizable and satisfactory when these features are considered from the viewpoint of the technical level of manufacturing semiconductor such as crystal growth, as well as the viewpoint of the dimensional limitation to be imposed as an optical element of a semiconductor laser element.

However, even with this semiconductor laser element, there are following problems, if the n-GaAs electric current barrier 102 is made into p-type.

Namely, in this case, the diffusion length Ln of electron, i.e. minority carrier would be several times as large as that of the diffusion length Lp of minority carrier (positive hole) when the n-GaAs current barrier 102 is made into p-type.

It follows that it is difficult to manufacture the semiconductor laser element, for the reason mentioned above.

The first feature of the conventional semiconductor laser element resides in that the electric current barrier is made into n-conductive type, and the second feature thereof resides in that the thickness of the electric current barrier is made such as to correspond to the diffusion length of the minority carrier.

The conventional semiconductor laser elements are characterized in two points. First, the current barrier is of n-conductivity type. Second, the current barrier has a thickness determined based on the minority-carrier diffusion length.

GaAs and AlGaAs have been exemplified as two alternative materials of the conventional elements. This is simply because only these two materials were known at the time of inventing the conventional semiconductor laser element. To,day, some other materials are available, which can be applied to the conventional element.

As a matter of fact, a structure having these two features are employed in a red visible semiconductor laser element using a material of $(Ga_xAl_{1-x})_{0.5}In_{0.5}P$ ($0 \leq X \leq 1$), which is developed later on and now is mass-produced.

FIG. 5 illustrates a schematic structure of a red visible semiconductor laser element adapting a structure containing these two features.

This semiconductor laser element is of so-called SBR (Selective Buried Ridge) structure, which is disclosed for example in Jpn. Pat. Appln. KOKAI Publication No. 62-200785, or Jpn. Pat. Appln. KOKAI Publication No. 62-200786. In this semiconductor laser element, a double hetero junction structure comprising an n-GaAs buffer layer 112, an n-InGaP buffer layer 113, an n-InGaAlP clad layer 114, an InGaP active layer 115 and p-InGaAlP clad layers 116, 117 and 118 is formed on an n-GaAs substrate 111.

The p-InGaAlP clad layer 117 is made of an Al-poor composition, and functions as an etching-stopper layer, whereas the p-InGaAlP clad layer 118 constitutes a stripe-like rib.

A p-InGaAlP contact layer 119 and a p-GaAs contact layer 120 are formed over this p-InGaAlP clad layer 118. Further, an n-GaAs current barrier layer 121 is formed on the side walls of these p-InGaAlP clad layer 118, p-InGaAlP contact layer 119 and p-GaAs contact layer 120.

Moreover, a p-GaAs cap layer 122 is formed over the p-GaAs contact layer 120 and n-GaAs current barrier layer 121. A p-side electrode 123 is formed over the p-GaAs cap layer 122, while an n-side electrode 124 is formed on the back surface of the n-GaAs substrate 111.

In this visible red semiconductor laser element constructed in this manner, an electron introduced from the p-side electrode 123 moves from the p-GaAs cap layer 122 to the n-side electrode 124, passing through the p-GaAs cap layer 122, the opening porting of the n-GaAs current barrier layer 121, the p-GaAs contact layer 120, the p-InGaAlP contact layer 119, the p-InGaAlP clad layers 118,117 and 116, the InGaP active layer 115, the n-InGaAlP clad layer 114, the n-InGaP buffer layer 113, the n-GaAs buffer layer 112, and the n-GaAs substrate 111.

In this case, the structure differs from that shown in FIG. 1, with respect to the crystal material constituting the layers, and also with respect to the stacking manner such that the structure as a whole is reversed in this case, so that the direction in flow of the electron is reversed. However the feature of confining the passage of electric current and light only to the striped region is the same.

In the semiconductor laser having such an inner stripe structure as mentioned above (to be more specific, an inner stripe structure that can be classified as being a refraction index guided type), it is possible to carry out both of the functions, i.e. current blocking and light absorption in a single layer so that the stabilization of lateral mode in posture of light can be relatively easily realized.

Further, since this structure is suited for use in the case where a large output is required, it has been applied to many of a near-infrared semiconductor laser element and a visible semiconductor laser element.

FIG. 6 schematically illustrates the structure of a semiconductor laser element having an inner stripe structure, which can be classified to a gain guided type.

Since this structure is suited for use in the case where a large output is required, it has been applied to many of a near-infrared semiconductor laser element and a visible semiconductor laser element.

In this semiconductor laser element, an n-GaAs buffer layer 132, an n-InGaP buffer layer 133, an n-InGaAlP clad layer 134, an InGaP active layer 135, a p-InGaAlP clad layers 136, an n-GaAs barrier layer 137 are formed on an n-GaAs substrate 131. In this structure, an opening 150 reaching to the p-InGaAlP clad layers 136 is formed in the n-GaAs barrier layer 137, and then a p-GaAs cap layer 138 is formed thereover.

Further, a p-side electrode 139 is formed on the upper surface of the p-GaAs cap layer 138, and an n-side electrode 140 is formed on the back side of the n-GaAs substrate 131.

Thus, this semiconductor laser element corresponds to the one having SBR structure shown in FIG. 5 wherein the thickness of p-InGaAlP clad layer 118 is uniformly formed. Although, the semiconductor laser element constructed in this manner is larger in astigmatic aberration, and inferior in optical property as compared with the semiconductor laser element having SBR structure, a large number of the semiconductor laser element constructed in this manner is still produced now, since the manufacturing process is relatively easy.

In the case of this structure, although the n-GaAs barrier layer 137 is not imposed to function to absorb light, since the absorption more or less of laser beam in the semiconductor laser element of ordinary design can not be disregarded, an n-type semiconductor crystal material is employed for the n-GaAs barrier layer 137.

As explained above, in the conventional semiconductor laser element of inner stripe structure as shown in FIGS. 5 and 6, the barrier layer is confined to the n-type in conductivity, thereby restricting the polarity of electric source for actuating the semiconductor element.

The semiconductor laser element is generally provided at the back side of the substrate with a heat sink in order to effectively remove the heat generated at the active layer thereof.

Generally, the heat sink is kept in same potential as that of the housing of the element, and connected to a common terminal. Accordingly, a positive electric source is exclusively employed in the near-infrared semiconductor laser element shown in FIG. 5, while a negative electric source is exclusively employed in the red visible semiconductor laser element shown in FIG. 6. Such a restriction to the polarity of the electric source is often inconvenient in the practical use.

Further, even if n-type conductivity is used for the electric barrier layer, an invalid current passing through the electric barrier layer, i.e. an electric current which is consumed for the light contributing in no way to the laser output, may often not to be disregarded.

As explained above, there is a defect in the conventional semiconductor laser device in that since the electric barrier layer is confined to an n-type conductivity, the polarity of the electric source is also required to be restricted.

Further, there is a problem in the conventional semiconductor laser device in that the invalid current can not be disregarded even if an n-type conductivity is employed for the electric barrier layer.

SUMMARY OF THE INVENTION

The object of the present invention is to provide a semiconductor laser device which is free from any restriction with respect to the polarity of electric source, and is capable of sufficiently minimizing the invalid current.

According to the present invention, there is provided, in view of solving above problems, a semiconductor laser device which comprises;

a first electrode layer formed of a first conductivity type semiconductor crystal;

a first clad layer formed of the first conductivity type semiconductor crystal having a band gap of $Eg_{c1}$ and a refraction index of $n_{c1}$ and deposited on the first electrode layer;

an active layer formed of a direct transitional semiconductor crystal of either first or second conductivity type having a band gap of $Eg_a$ and a refraction index of $n_a$ with conditions of $Eg_{c1} > Eg_a$, and $n_{c1} < n_a$ and deposited on the first clad layer;

a second clad layer formed of a semiconductor crystal of the second conductivity type having a band gap of $Eg_{c2}$ and a refraction index of $n_{c2}$ with conditions of $Eg_{c2} \geq Eg_a$, and $n_{c2} < n_a$ and deposited on the active layer;

a current barrier layer having a stripe-like current inlet opening and formed of a semiconductor crystal of the first conductivity type having a band gap of $Eg_{cb}$ and a refraction index of $n_{cb}$ with conditions of $Eg_{cb} \leq Eg_a$, and $n_{cb} > n_a$, said current barrier layer being deposited on the second clad layer;

a photoelectric current barrier layer formed of a semiconductor crystal of the first conductivity type having a band gap of $Eg_{ocb}$ and a refraction index of $n_{ocb}$ with conditions of $Eg_{ocb} \geq Eg_a$, and disposed between the current barrier and the second clad layer;

a second electrode layer formed of a semiconductor crystal of the second conductivity type, and disposed on the current barrier layer and on a portion of the second clad layer that is exposed at the electric current inlet opening of the current barrier layer;

a first electrode made of a metal, and disposed on the second electrode layer; and a second electrode made of a metal, and disposed on the back surface of the first electrode layer.

It has been made possible according to semiconductor laser device of the present invention having the construction as mentioned above to block, by means of hetero junction barrier wall, the inflow of light-induced current into the current barrier regardless of the conductive type, i.e. n-type or p-type of the current barrier used for the inner stripe structure, so that the thickness, conductive type and carrier density of the current barrier can be arbitrarily selected. Therefore, it has been made possible according to the semiconductor laser device of the present invention to avoid any restriction with respect to the polarity of electric source, and to sufficiently minimize the invalid current.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a graph illustrating the dependency of the carrier concentration on the diffusion lengths of electron as well as of positive hole in the current barrier;

FIG. 7 is a partial sectional view of the general structure of semiconductor laser element according to one embodiment of the present invention;

DETAILED DESCRIPTION OF THE PREFERRED EMBODIMENTS

Figure 1:
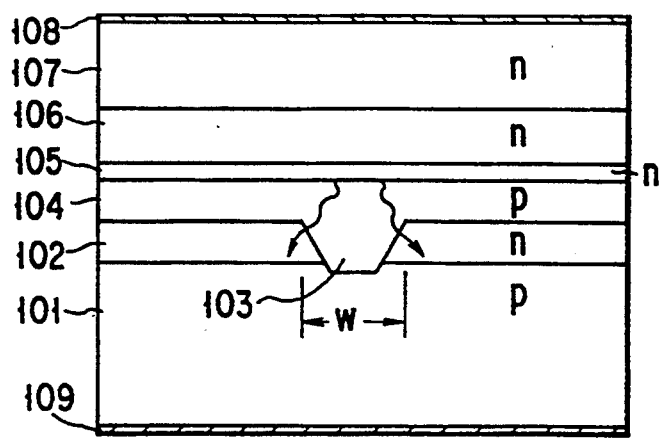
FIG. 1 is a partial sectional view of the general structure of the conventional red visible semiconductor laser element.
Figure 2:
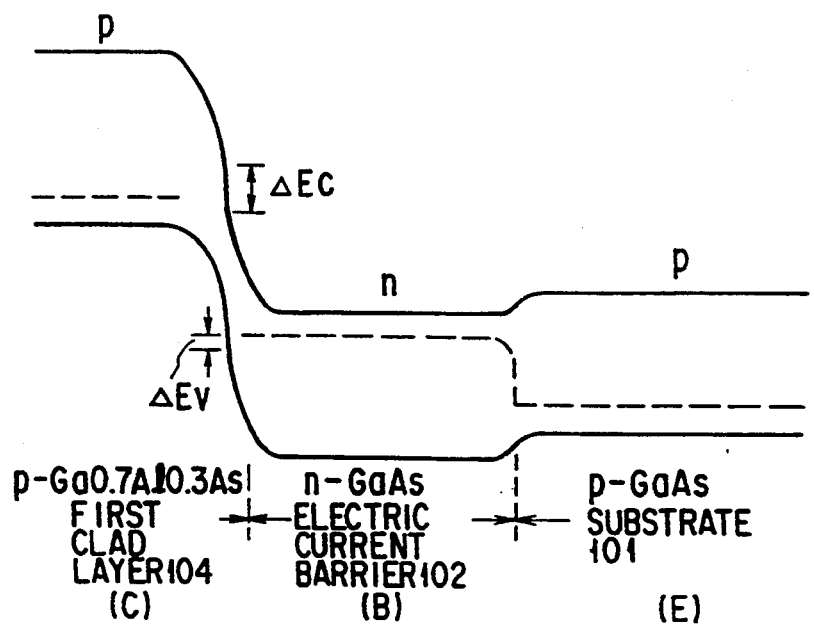
FIG. 2 is a graph illustrating an energy band structure in the semiconductor laser element shown in FIG. 1.
Figure 3:
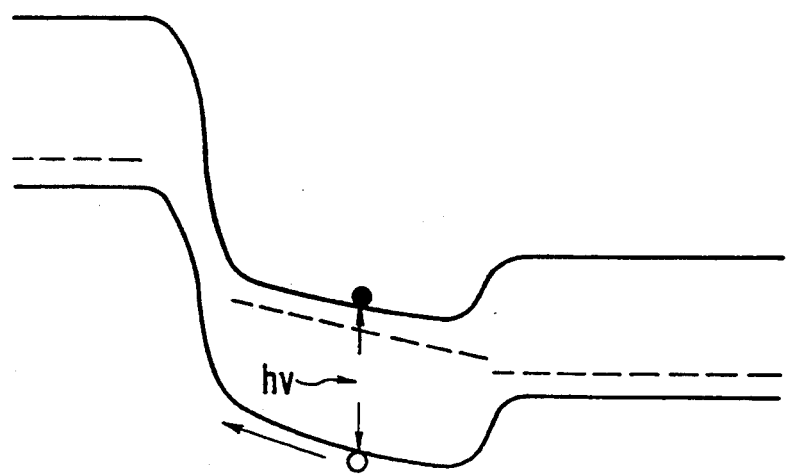
FIG. 3 is a graph illustrating a movement in an energy band structure in the semiconductor laser element shown in FIG. 1.

This invention will be further explained with reference to the examples shown in the drawings.

FIG. 7 represents a general structure of a semiconductor laser element according to a first embodiment of this invention.

This semiconductor laser element is of so-called SBR (Selective Buried Ridge) structure, and comprises a p-GaAs (gallium, arsenic) substrate 11 functioning as a first electrode layer, on which a plurality of layers i.e. a p-GaAs buffer layer 12, a p-InGaP (indium, gallium, phosphorus), a buffer layer 13 functioning as an easy conductive layer, a p-InGaAlP (indium, gallium, aluminum, phosphorus) clad layer 14 functioning as a first clad layer, an InGaP active layer 15 and an n-InGaAlP clad layer (a second clad layer) 16 are formed in this order.

This n-InGaAlP clad layers 16 is of single layer, and worked to form a stripe-like rib, i.e. thus forming a ridge 16a.

On this n-InGaAlP clad layers 16 is formed an n-GaAs contact layer 17, as well as a p-GaAs current barrier layer 18 provided with a stripe-like current inlet opening 23 formed in conformity with the upper surface of the n-GaAs contact layer 17.

Further, there is formed a photoelectric current barrier layer 19 between the p-GaAs current barrier layer 18 and the n-InGaAlP clad layers 16.

Additionally, a p-GaAs cap layer (a second electrode layer) 20 is formed over the n-GaAs contact layer 17 and the p-GaAs current barrier layer 18. A p-side electrode (a first electrode) 21 is formed over the n-GaAs cap layer 20, while an n-side electrode 22 is formed on the back surface of the p-GaAs substrate 11.

The p-InGaAlP clad layer 14 is formed of, for example, $(Ga_{0.3}Al_{0.7})_{0.5}In_{0.5}P$ (a band gap is denoted as $Eg_{c1}$ and a refraction index as $n_{c1}$) which is a semiconductor crystal of p-conductive type (a first conductive type), and has a thickness of about 1 μm.

The InGaP active layer 15 is formed of, for example, GaInP (a band gap is denoted as $Eg_a$ and a refraction index as $n_a$, with conditions of $Eg_{c1} > Eg_a$, and $n_{c1} < n_a$) which is a direct transitional semiconductor crystal of p-conductive type or n-conductivity type (a second conductivity type), and has a thickness of about 0.05 μm.

The n-InGaAlP clad layer 16 is formed of for example, $(Ga_{0.3}Al_{0.7})_{0.5}In_{0.5}P$ (a band gap is denoted as $Eg_{c2}$ and a refraction index as $n_{c2}$, with conditions of $Eg_{c2} > Eg_a$, and $n_{c2} < n_a$). The clad layer 16 is about 1 pm thick at the ridge 16a, and about 0.2 μm thick at any other portion.

The maximum width (bottom) of the ridge 16a is about 6 pm.

The p-GaAs current barrier layer 18 is formed of, for example, p-type semiconductor of GaAs (the band gap is denoted as $Eg_{cb}$ and the refraction index as $n_{cb}$, with the condition of $Eg_{cb} \leq Eg_a$, and $n_{cb} > n_a$), the density of the positive hole thereof being set to about $5 \times 10^{18}$ cm$^{-3}$, and the thickness thereof being set to about 1 μm.

The diffusion length Lp of minority carrier (electron) in this p-GaAs current barrier layer 18 is set to 3 μm as shown in FIG. 4, which is larger than the thickness of $d_{CB}$ (about 1 μm).

The p-InGaAlP photoelectric current barrier layer 19 is formed of a p-type semiconductor crystal having a larger band gap than that of the p-GaAs current barrier layer 18, and a chemical composition of $(Ga_{0.3}Al_{0.7})_{0.5}In_{0.5}P$ (a band gap is denoted as $Eg_{ocb}$ and a refraction index as $n_{ocb}$, with the condition of $Eg_{ocb} \geq Eg_a$), and the thickness thereof is set to about 1 μm.

This p-InGaAlP photoelectric current barrier layer 19 can be formed by performing the solid-phase diffusion of a dopant from the p-GaAs current barrier layer 18 having a thickness of about 0.1 μm, thereby reversing the conductivity type of a portion of the clad layer 16 having a composition of n-InGaAlP.

To more specific, zinc (Zn) is employed as a dopant, and the crystal growth is performed by means of an organometallic vapor deposition method (MOCVD), thereby performing the solid-phase diffusion during this crystal growth.

The formation of the p-InGaAlP photoelectric current barrier layer 19 can also be performed by a crystal growth other than the solid phase diffusion as explained in this embodiment.

This semiconductor laser element further comprises a pair of reflecting surfaces formed in perpendicular to the longitudinal axis of the stripe-like current inlet opening 23 of the p-GaAs current barrier layer 18, and has an outer shape of rectangular parallelepiped about 100 μm in thickness, about 300 μm in width, and about 300 μm in length (the length of a resonator).

Figure 5:
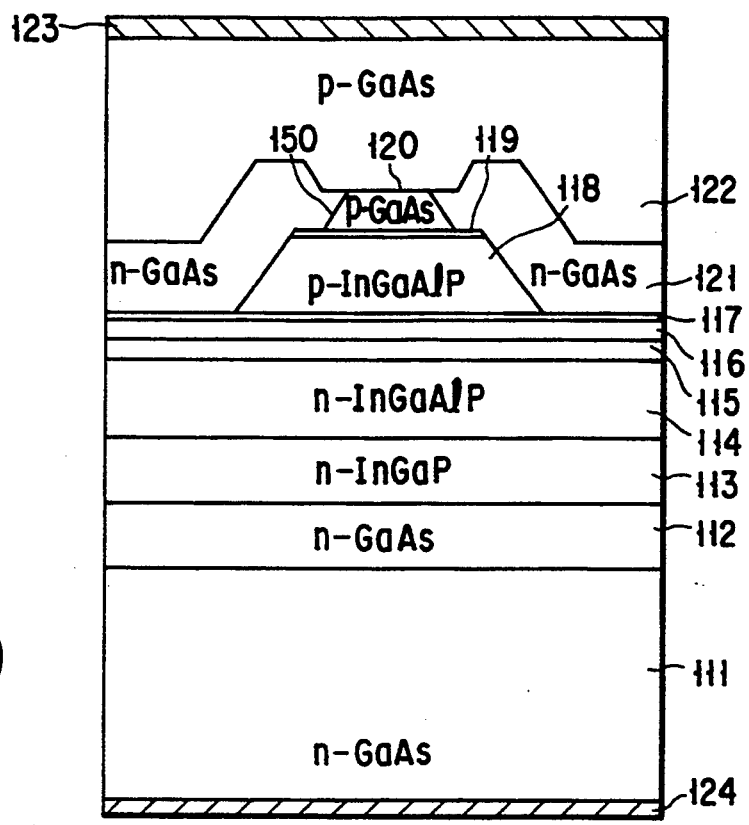
FIG. 5 is a partial sectional view of the general structure of the conventional semiconductor laser element of SBR structure.

With this semiconductor laser element having constructed in this manner, i.e. a structure wherein the conductivity type of all layers of the semiconductor laser element having the conventional SBR structure as shown in FIG. 5 are reversed; a clad layer functioning as an etching stopper layer is omitted thereby making the n-InGaAlP clad layer 16 provided with the ridge 16a into a single layer; and the photoelectric current barrier layer 19 consisting of p-InGaAlP and having a thickness of about 0.1 μm is incorporated; it has become possible to continuously actuate the device even at a maximum temperature of about 100° C., with the same degree of performance as that of the conventional one being obtainable (namely, a driving current was found to be about 45 mA at room temperature under the conditions of 670 nm in wavelength, single in vertical and lateral modes and 5 mW).

The principle of the operation of the semiconductor laser element of this embodiment having the performance as explained above will be explained below.

Figure 8:
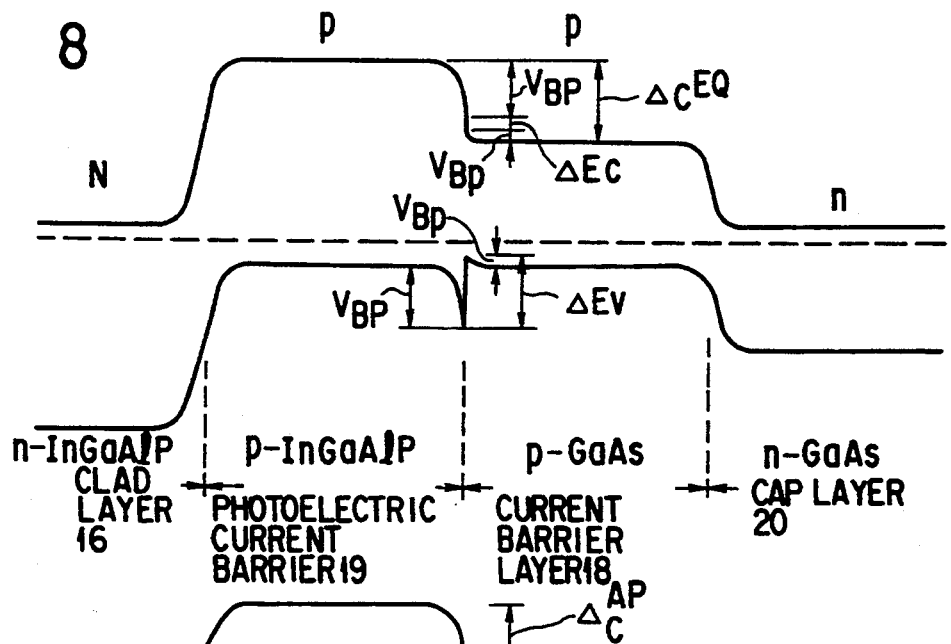
FIG. 8 is a graph illustrating an four-ply energy band structure outside the ridge in the semiconductor laser element shown in FIG. 7.

FIG. 8 is a 4-ply energy band structure comprising the n-InGaAlP clad layer 16 through n-GaAs cap layer 20.

In this case, attention should be paid to the height $\Delta c^{EQ}$ of the wall in the conductive band, which can be recognized at the interface of the hetero junction of the pair of p-type conductive layer P disposed at the central portion (the p-InGaAlP photoelectric current barrier layer 19 and the p-GaAs current barrier layer 18).

This height $\Delta c^{EQ}$ of the wall can be represented by the following formula.

$$\Delta c^{EQ} = V_{BP} + V_{Bp} + \Delta E_c = \Delta E_c = 0.88 \text{ ev} \quad (1)$$

wherein $V_{BP}$ represents a built-in potential difference to be formed by the space charge (an acceptor which is negatively charged) on the side of p-InGaAlP photoelectric current barrier layer 19, $V_{Bp}$ represents a built-in potential difference to be formed by the space charge (a positive hole which is caught by the depression in valence band) on the side of the p-GaAs current barrier layer 18, $\Delta E_c$ represents the magnitude of discontinuity of conduction band between a pair of crystals, and $\Delta E_v$ is the magnitude of discontinuity of valence band. In this embodiment, $\Delta E_v$ is about 0.50 eV, and $\Delta E_c$ is about 0.38 eV.

Figure 9:
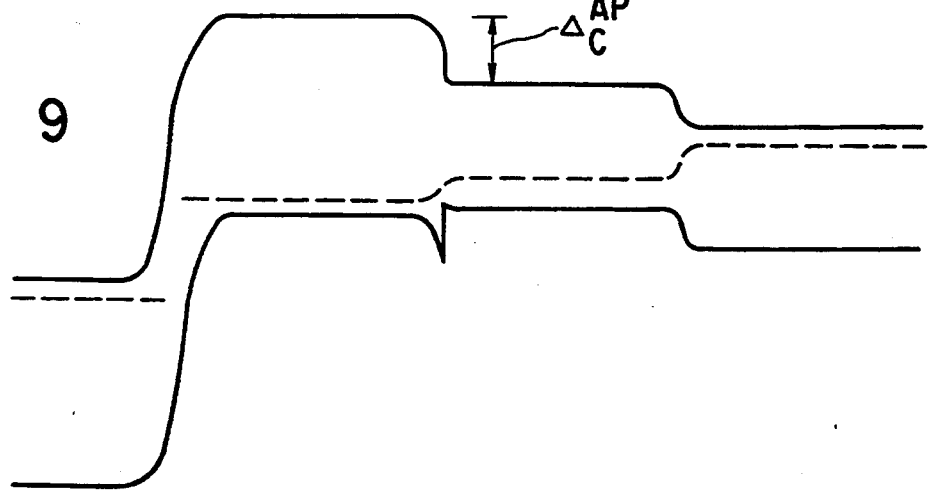
FIG. 9 is a graph illustrating behavior in an energy band structure in the semiconductor laser element shown in FIG. 7.

In the operation state of the element shown in FIG. 9, an external impressed voltage $E_{AP}$ (about 0.5V) is applied on the both ends of the drawing, i.e. the clad layer 16 and the cap layer 20.

By the application of this voltage, the spaces between the n-GaAs cap layer 20 and the p-GaAs current barrier layer 18, and between the p-GaAs current barrier layer 18 and the p-InGaAlP photoelectric current barrier layer 19 are forward-biased. On the contrary, the space between the p-InGaAlP photoelectric current barrier layer 19 and n-InGaAlP clad layer 16 is reverse-biased.

Since the external impressed voltage $E_{AP}$ is distributed mainly to the junction of the reverse bias, and therefore the distribution of the external impressed voltage $E_{AP}$ to the hetero junction between the p-GaAs current barrier layer 18 and the p-InGaAlP photoelectric current barrier layer 19 is not so large, the height $\Delta C^{AP}$ in this case can be represented by the following formula (2).

$$\Delta c^{AP} = \Delta c^{EQ} - \gamma E_{AP} (\gamma << 1) \quad (2)$$

Since this value of $\Delta c^{AP}$ is extremely large as compared with the average kinetic energy $E_{TH} = 3kT$ (about 0.078 eV) at the room temperature of electron, it is possible to block the optically excited electron in the p-GaAs current barrier layer 18 from being discharged into the n-InGaAlP clad layer 16.

Figure 10:
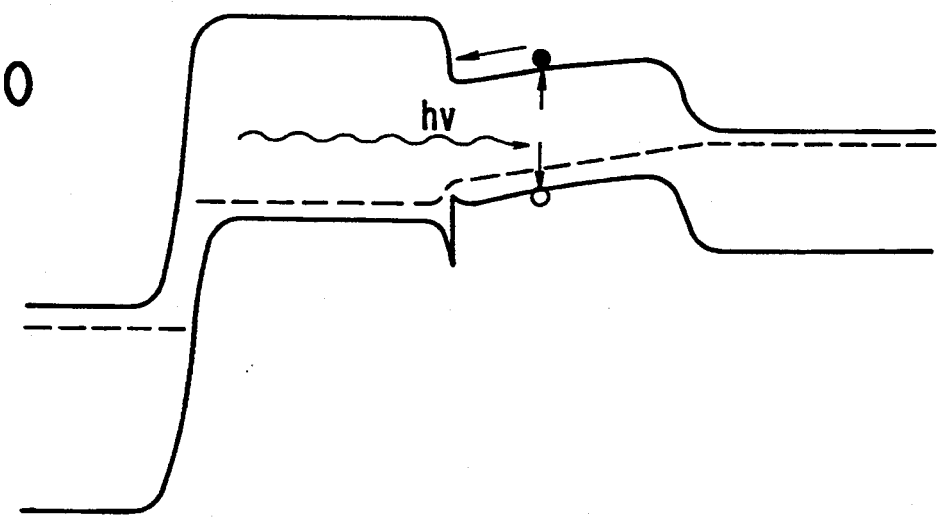
FIG. 10 is a graph illustrating another behavior in an energy band structure in the semiconductor laser element shown in FIG. 7.

As a result, the p-GaAs current barrier layer 18 is negatively charged as shown in FIG. 10, to block the above-mentioned invalid current.

Namely, since the p-InGaAlP photoelectric current barrier layer 19 having the same conductivity type as that of the p-GaAs current barrier layer 18, and made of a crystalline material having a larger band gap than that of the p-GaAs current barrier layer 18 is inserted between the p-GaAs current barrier layer 18 and the n-InGaAlP clad layer 16, it is possible to allow the light-induced current $I_{OPT}$ to be blocked by the band discontinuity of the minority carrier to be generated at the hetero junction between the p-InGaAlP photoelectric current barrier layer 19 and the p-GaAs current barrier layer 18.

Accordingly, it is possible to sufficiently minimize the invalid current even with the p-GaAs current barrier layer 18 having a thickness of about 1 μm, which is thinner than the diffusion length Ln (about 3 μm) of the minority carrier.

In this manner, it has become possible to obtain a semiconductor laser device having an excellent property as mentioned above, even with a structure which is so far considered as being inherently large in invalid current and hardly suited for continuous operation at the room temperature.

In this embodiment, the crystal growth is performed by means of MOCVD method, since it is required to differentiate in crystal composition in an abrupt manner at the interface of the hetero junction in order to realize a band discontinuity at the hetero junction. However, it is also possible to employ a molecular beam epitaxy (MBE).

Followings are explanations on the second embodiment of this invention.

Figure 11:
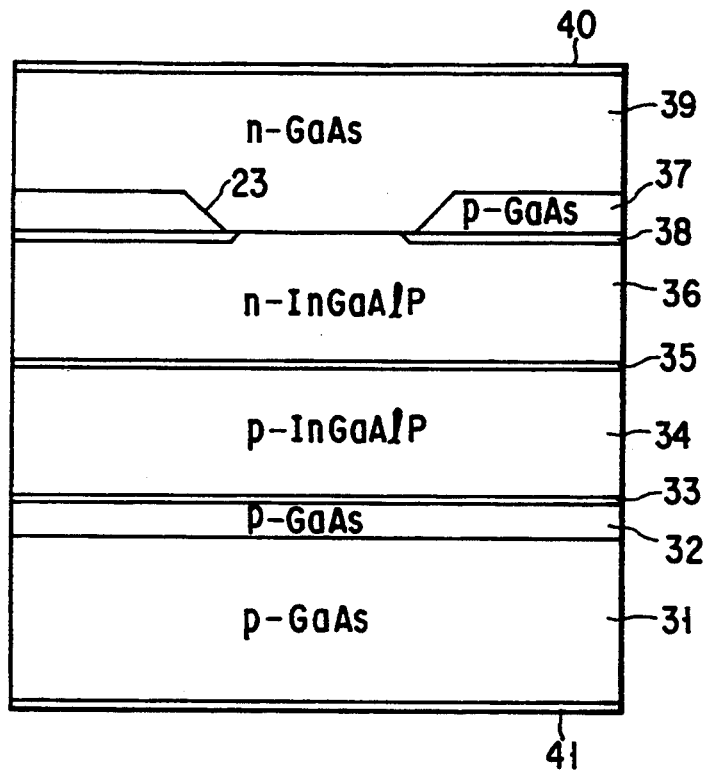
FIG. 11 is a partial sectional view of the general structure of semiconductor laser element according to another embodiment of the present invention.

FIG. 11 schematically illustrates the construction of semiconductor laser element having an internal stripe structure, which can be classified as being a gain guided type laser element.

In this embodiment, a plurality of layers, i.e. a p-GaAs buffer layer 32, a p-InGaAsP buffer layer (an easy current layer) 33, a p-InGaAlP clad layer (a first clad layer) 34, an InGaP active layer 35, an n-InGaAlP clad layer (a second clad layer) 36 and a p-GaAs current barrier layer 37 are formed on for example a p-GaAs substrate (a first electrode layer) 31.

This p-GaAs current barrier layer 37 is provided with a stripe-like opening 23, which reaches to the n-InGaAlP clad layer 36. Further, between the p-GaAs current barrier layer 37 and the n-InGaAlP clad layer 36 is formed a photocurrent barrier layer 38 consisting of about 0.1 μm thick p-InGaAlP.

On the surface of the p-GaAs current barrier layer 37 as well as on the surface of a portion of the n-InGaAlP clad layer 36 that is exposed through the opening of the p-GaAs current barrier layer 37 is formed an n-GaAs cap layer (a second electrode layer) 39.

Additionally, a p-side electrode (a first electrode) 40 is formed on the upper surface of this n-GaAs cap layer (a second electrode layer) 39, while on the bottom surface of the p-GaAs substrate 31 is formed an n-side electrode (a second electrode) 41.

The photocurrent barrier layer 38 consisting of p-InGaAlP can be formed as in the case of the first embodiment by means of a solid-phase diffusion during the crystal growth according to the MOCVD method, or by means of crystal growth according to the MBE method so as to obtain a composition having a larger band gap than that of the p-GaAs current barrier layer 37.

Figure 6:
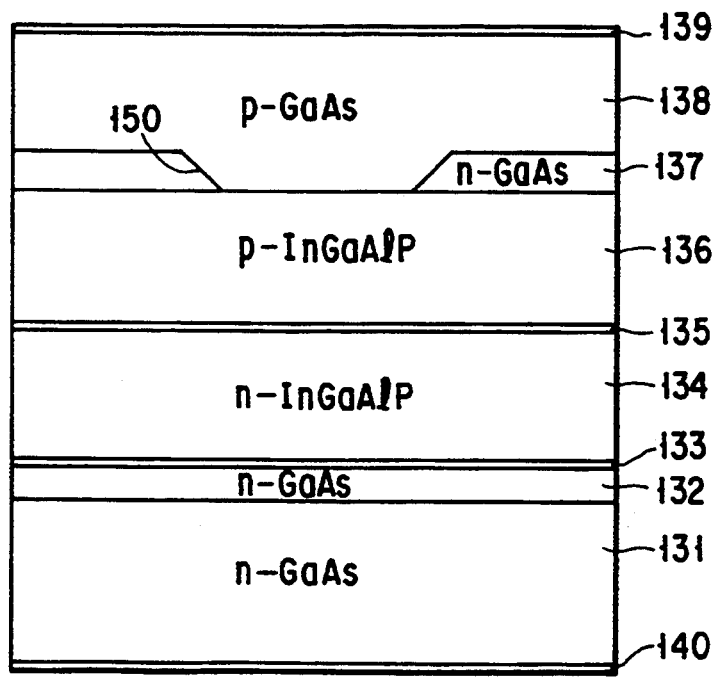
FIG. 6 is a partial sectional view of the general structure of the conventional semiconductor laser element of gain guided inner stripe structure.

Even with this semiconductor laser element having constructed in this manner, i.e. a structure wherein the conductivity type of all layers of the semiconductor laser element having an inner stripe structure that can be classified as being the conventional gain guided type as shown in FIG. 6 are reversed, and the photoelectric current barrier layer 38 consisting of p-InGaAlP having a thickness of about 0.1 μm is inserted, it is possible to obtain a semiconductor laser element having a satisfactory performance.

A third embodiment of this invention will now be explained as follows.

Figure 12:
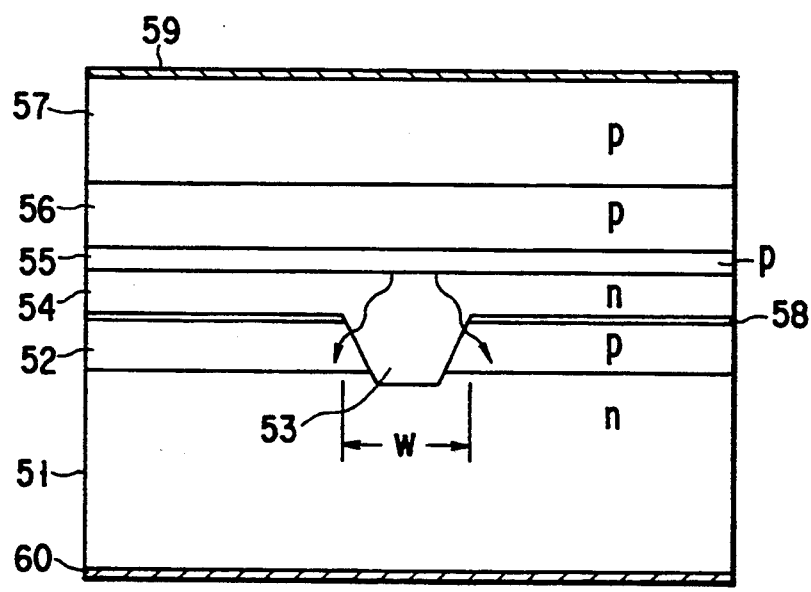
FIG. 12 is a partial sectional view of the general structure of semiconductor laser element according to still other embodiment of the present invention.

FIG. 12 shows schematically the construction of a near-infrared semiconductor laser element having an inner stripe structure.

This semiconductor laser element is constructed in such a manner that an electric current barrier layer 52 consisting of p-GaAs is first formed on the upper surface of a n-GaAs substrate 51, a stripe groove 53 having a stripe-like opening is formed in the electric current barrier 52, and then a plurality of layers viz. a second clad layer 54 consisting of n-GaAlAs, an active layer 55 consisting of p-GaAlAs, a first clad layer 56 consisting of p-GaAlAs and a cap layer 57 (a first electrode layer) consisting of p-GaAs are stacked in this order over the n-GaAs electric current barrier 52 as well as over the stripe groove 53.

Further, a photocurrent barrier layer 58 consisting of p-InGaAlP is formed between the electric current barrier 52 and the second clad layer 54 as in the case of the first and second embodiments by means of a solid-phase diffusion during the crystal growth according to the MOCVD method, or by means of crystal growth according to the MBE method, the photocurrent barrier layer 58 being formed to have a larger band gap than that of the p-GaAs current barrier layer 52, and a thickness of about 0.1 μm.

Additionally, an n-side electrode (a second electrode) 59 is formed on the surface of the p-GaAs cap layer 57, while a p-side electrode (a first electrode) 60 is formed on the back surface of the n-GaAs substrate 51.

Even with this semiconductor laser element having constructed in this manner, i.e. a structure wherein the conductivity type of all layers of the semiconductor laser element having an inner stripe structure of the conventional near-infrared semiconductor laser element as shown in FIG. 1 are reversed, and the photoelectric current barrier layer 58 consisting of p-InGaAlP having a thickness of about 0.1 μm is inserted, it is possible to obtain a semiconductor laser element having almost the same performance as that of the conventional element.

Even with this current barrier layer having such a conductivity as generally employed in an inner stripe structure, it is possible to block the light-induced current from flowing into the current barrier layer.

Namely, in this embodiment, the photoelectric current barrier layer 58, which is of the same conductivity type as that of the current barrier layer, and made of a crystalline material having a larger band gap than that of this current barrier layer is inserted between the current barrier layer 52 and the clad layer 54.

Accordingly, it is possible to allow the light-induced current to be blocked by the band discontinuity of the minority carrier to be generated at the hetero junction between the photoelectric current barrier layer 58 and the current barrier 52.

Accordingly, it is possible to sufficiently minimize the invalid current even with the current barrier layer having a thickness thinner than the diffusion length of the minority carrier.

Accordingly, it is possible to arbitrarily select the thickness, conductive type and carrier density of the current barrier. In particular, it has been made possible to employ a p-type current barrier layer and to easily avoid any restriction with respect to the type of polarity of electric source in the semiconductor laser element of an inner stripe structure including a current barrier layer having a thickness of about 1 μm, which is an appropriate thickness in view of manufacturing a semiconductor laser element.

In any of the above embodiments, a material of GaAs is employed as a crystal material of current barrier layer. However, the material is not restricted to GaAs, but any other kind of material can be employed as long 10 as such a material is capable of absorbing a laser beam, and the refraction index thereof is smaller than that of clad layer disposed next to the current barrier layer.

Further, this invention is not limited to a semiconductor laser element where AlGaAs or InGaAlP is employed as a material for a double hetero-structure, but is also applicable to a blue semiconductor laser element employing for example a III-V group crystal or a II-VI group crystal such as ZnSe, which is now being developed.

Any other modification is possible as long as the gist of the invention is not altered.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor laser device comprising:
   a first electrode layer formed of a first conductivity type semiconductor crystal;
   a first clad layer formed of the first conductivity type semiconductor crystal having a band gap of $Eg_{c1}$ and a refraction index of $n_{c1}$ and deposited on the first electrode layer;
   an active layer formed of a direct transitional semiconductor crystal of the first or second conductivity type having a band gap of $Eg_a$ and a refraction index of $n_a$ with conditions of $Eg_{c1} > Eg_a$, and $n_{c1} < n_a$ and deposited on the first clad layer;
   a second clad layer formed of a semiconductor crystal of the second conductivity type having a band gap of $Eg_{c2}$ and a refraction index of $n_{c2}$ with conditions of $Eg_{c2} > Eg_a$, and $n_{c2} < n_a$ and deposited on the active layer;
   a current barrier layer deposited on the second clad layer and having a stripe-like current inlet opening and formed of a semiconductor crystal of the first conductivity type having a band gap of $Eg_{cb}$ and a refraction index of $n_{cb}$ with conditions of $Eg_{cb} \leq Eg_a$, and $n_{cb} > n_a$;
   a photoelectric current barrier layer formed of a semiconductor crystal of the first conductivity type having a band gap of $Eg_{ocb}$ and a refraction index of $n_{ocb}$ with conditions of $Eg_{ocb} \geq Eg_a$, and disposed between the current barrier and the second clad layer;
   a second electrode layer formed of a semiconductor crystal of the second conductivity type, and disposed on the current barrier layer and on a portion of the second clad layer that is exposed at the electric current inlet opening of the current barrier layer;
   a first electrode made of a metal, and disposed on the second electrode layer; and
   a second electrode made of a metal, and disposed on the back surface of the first electrode layer.

2. The semiconductor laser device according to claim 1, wherein the first conductivity type is p-type, and the second conductivity type is n-type.

3. The semiconductor laser device according to claim 1, wherein the crystal material constituting the first clad layer, the active layer, the second layer, and the photocurrent barrier layer is $(Ga_xAl_{1-x})_{0.5}In_{0.5}P$ (wherein x differ from layer to layer with a condition of $0 \leq x \leq 1$), and the crystal material constituting the current barrier layer is $Al_yGa_{1-y}As$ ($0 \leq y \leq 1$).

4. The semiconductor laser device according to claim 1, wherein the second clad layer has a stripe-like projected portion which protrudes into an opening for current injection so as to form a refraction index guided type inner stripe structure.

5. The semiconductor laser device according to claim 1, wherein the second clad layer is formed to have a uniform thickness so as to form a gain guided type inner stripe structure.

* * * * *